United States Patent [19]

Adachi et al.

[11] Patent Number: 4,885,604

[45] Date of Patent: Dec. 5, 1989

[54] EXPOSURE APPARATUS

[75] Inventors: Nobuo Adachi, Kawasaki; Shinya Ogawa, Chofu, both of Japan

[73] Assignee: Orc Manufacturing Co., Ltd., Japan

[21] Appl. No.: 238,774

[22] Filed: Sep. 1, 1988

[30] Foreign Application Priority Data

Jun. 3, 1988 [JP] Japan ............................ 63-73970[U]

[51] Int. Cl.⁴ ............................................ G03B 27/52
[52] U.S. Cl. ........................................................ 355/30
[58] Field of Search .................. 355/26, 30, 67, 79, 355/91, 94, 99

[56] References Cited

U.S. PATENT DOCUMENTS

| 3,627,416 | 12/1971 | Benson | 355/91 X |
| 4,541,714 | 9/1985 | Miyamoto | 355/99 |
| 4,565,443 | 1/1986 | Yazaki | 355/26 X |
| 4,786,947 | 11/1988 | Kosugi et al. | 355/30 |

Primary Examiner—E. T. Hix
Assistant Examiner—Brian W. Brown
Attorney, Agent, or Firm—Fidelman & Wolffe

[57] ABSTRACT

An exposure apparatus comprising lighting means such as ultra-violet lamp and reflecting mirror placed in an exposure room and also tray arranged to move in and out from the exposure room, wherein cooling means is provided. The cooling means blows cold air onto the surface of the tray.

A cooling room is formed next to the exposure room. The cooling means is composed of air radiator and air fan. Refrigerant such as cold water passes through the air radiator and the air fan blows air in the cooling room onto the surface of the tray through the radiator. Exhaust fan arranged to send air in the exposure room into the cooling room is also provided between the exposure room and the cooling room.

4 Claims, 2 Drawing Sheets

EXPOSURE APPARATUS

BACKGROUND OF THE INVENTION

The present invention relates to an exposure apparatus especially for use of solder masks, and characterized in that it can control the exposing face's temperature.

With recent advanced technology in the semiconductor industry, printed circuit boards are requiring finer lines and spacing. To meet the requirement, the industry is leaning towards using dry film solder masks and photo-type liquid solder masks to improve the printed circuit board's reliability and quality.

However with the prior apparatus, circuit patterns formed on the board are not as fine as it is required because photo masks and solder masks are effected by heat rays which radiates from the ultra-violet lamp. This derives from the fact that an exposure apparatus, the type that can also be used for photo masks, produces exposing energy approximately ten times larger than the energy exposed from a regular exposure apparatus, thus causing enormous affects to the exposing face. To prevent heat rays, the lamps, for example, have been designed to be cooled by cold water. However, cooling the lamp was not effective enough.

The present invention's purpose, therefore, is to provide an exposure apparatus with the ability to cool down and control the exposing face's temperature and create finer circuit patterns.

DETAILED DESCRIPTION OF THE INVENTION

The present invention will be described below refering to the figures.

Figure 1:
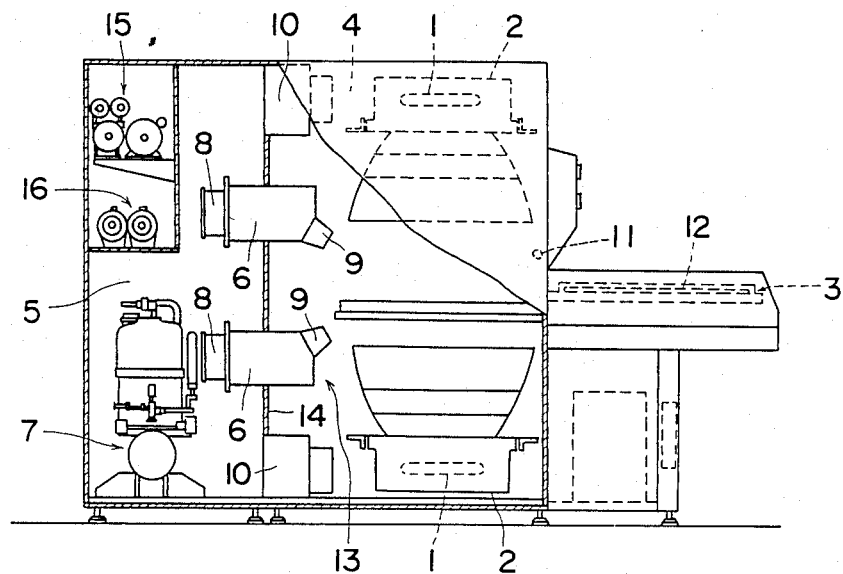
FIG. 1 shows side view of preferred embodiment of the present invention.
Figure 2:
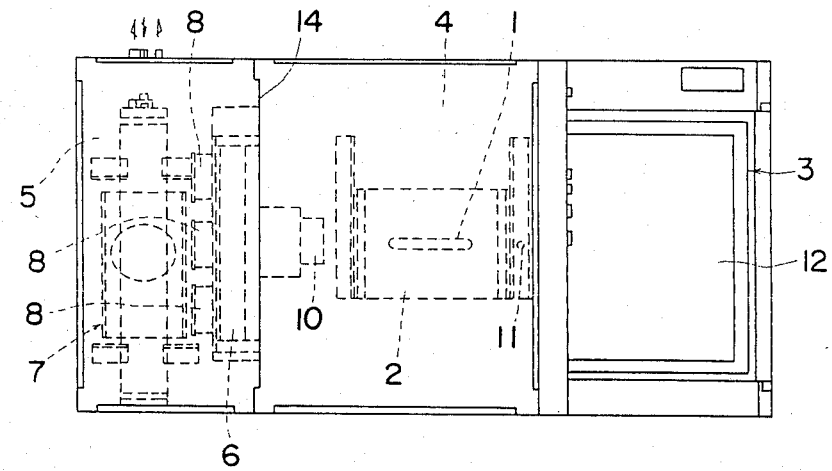
FIG. 2 shows plan view of the preferred embodiment.
Figure 3:
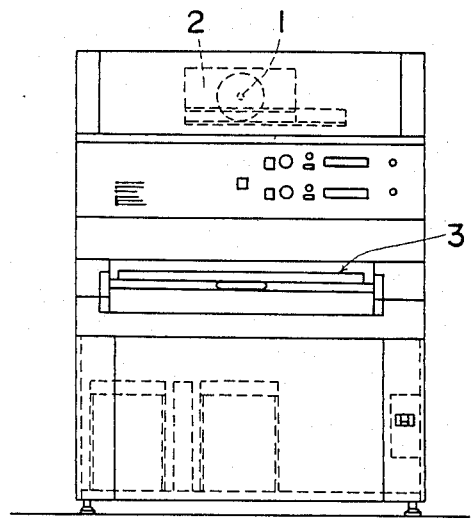
FIG. 3 shows its elevational view.
Figure 4:
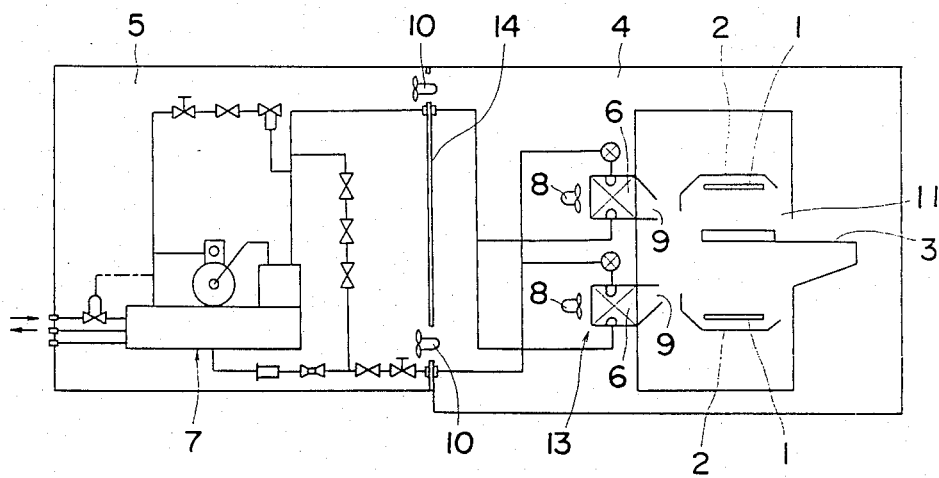
FIG. 4 shows flow chart of cooling system of the exposure surface.

FIG. 1 through 3 shows an exposure apparatus comprising two ultra-violet lamps 1, one on the upper portion and the other on the lower portion in the exposure room. The two lamps 1 radiate ultra violet rays onto the both surface of the trays and, thus, create circuit patterns on the both side at the same time.

The lamp, 7 kw indirect-high-intensity ultra-violet lamp 1, is cooled by cold water, and it is surrounded by light reflecting mirrors 2 that provide equal illumination onto the board. The apparatus can use two types of interchangeable ultra-violet lamps 1. It allows selection of the appropriate light spectrum and, thus, minimizes exposure time.

This apparatus has two trays 3, both of which can slide into and slide out from the exposure room. While one tray is set in the exposure room 4 and receives exposing procedure, the other tray is out of the room and a printed circuit 12 board can be removed from or set on it. Since the two different work procedures can be accomplished at the same time, working time can be saved and productivity improves.

The cooling room is provided next to the exposure room. The cooling means 13 each composed of a air radiator and a fan are provided on the wall 14 between the exposure room and the cooling room. Cold water passes through the radiator 6 and wind raised by the fan blows through the radiator 6 and makes cold wind. The cold wind then is blown through the blow mouth 9 on both surfaces of the tray and it cools down the printed circuit board 12 and solder mask. Therefore, heat rays do not cause any negative effects to photo masks and solder mask and thus fine print pattern can be obtained.

An exhaust fan 10 is provided on the wall 14 between the exposure room 4 and the cooling room 5. The exhaust fan 10 effectively send air in the exposure room into the cooling room 5, and prevent formation of dew on the tray 3. The air in the exposure room 4 has once been cooled by the cooling means 13. The air in the exposure room 4 is circulated back into the cooling room 5 and is again refrigerated by the cooling means 13 and blown onto the tray 3. Since the cold air in the apparatus is circulated within the apparatus, it will not produce dew compared to a way that take humid air in the atmosphere and use it as cooling air. Of course, the exposure room 4 and the cooling room are both airtightly constructed in order not to allow the wet air in the atmosphere to flow in rather easily.

A refrigerating unit, composed of such as compresser, is cooled down by the cold air in the cooling room. It is a good advantage to maintain the refrigerating unit.

A thermostat 11 is provided close to the tray in the exposure room. The thermostat 11 reads the temperature and automatically turn on and off the fan and control the temperature to the point it had previously been set. When the temperature is higher than it had been set, the thermostat turn on the fan and cool down the temperature, and when the temperature is lower, it turns off the fan. The temperature of the tray, therefore, is controlled at the preferable point.

A vacuum pump 15 is placed at the upper-left side in the cooling room, that creates vacuum atmosphere where the printed circuit board 12 is set. Under the vacuum pump 15, an air compresser 16 is placed. It cools both edges of the lamp 1.

Although the above explained apparatus uses a indirect-water-cooled UV lamp and is a type of exposing both surfaces of a tray at the same time, the present invention is not limited in such an apparatus. For example, the apparatus can use a air-cooled lamp 1 or metal haloid lamp, and it can be a type that exposes only a single surface of the tray 3.

In the present invention the number and setting place of each means such as the cooling unit, exhaust fan 10 and thermostat 11 should not be limited as they are described above. A necessary number of each means are comprised and they can be located at suitable places to efficiently pursue their objectives.

What is claimed is:

1. In an exposure apparatus having a light source of an ultra-violet lamp and mirror situated in an exposure room of an overall housing, and a circuit board supporting tray moveable in and out of said exposure room, the improvement comprising:

a cooling room within said housing and separated from said exposure room by a common wall;

cooling means, extending through said common wall, for cooling said tray and a circuit board mounted thereon, said cooling means comprising a refrigeration unit and a fan and radiator for cooling air and circulating cooled air from said cooling room into said exposure room; and blow mouth means for directing said cooled air directly onto at least one surface of said tray.

2. The improvement of claim 1, and further comprising:

another blow mouth means for directing cooled air directly onto another surface of said tray.

3. The improvement of claim 1, wherein said cooling room further comprises:

a vacuum pump and an air compressor housed therein and operatively associated with said exposure room to provide positive and negative air to said exposure room and generative of heat within said cooling room; and said cooling means also cooling said vacuum pump, air compressor and refrigeration unit.

4. The improvement of claim 1, and further comprising:

additional fan means for forcing air from said exposure room to said cooling room.

* * * * *